United States Patent
Sugiyama et al.

(10) Patent No.: US 6,531,654 B2
(45) Date of Patent: Mar. 11, 2003

(54) SEMICONDUCTOR THIN-FILM FORMATION PROCESS, AND AMORPHOUS SILICON SOLAR-CELL DEVICE

(75) Inventors: Shuichiro Sugiyama, Kyoto (JP); Masahiro Kanai, Tokyo (JP); Takahiro Yajima, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/861,520

(22) Filed: May 22, 2001

(65) Prior Publication Data

US 2002/0022349 A1 Feb. 21, 2002

(30) Foreign Application Priority Data

May 23, 2000 (JP) ........................ 2000-151045

(51) Int. Cl.[7] ........................ H01L 31/04; H01L 31/20
(52) U.S. Cl. .................. 136/258; 136/255; 136/261; 257/458; 257/52; 257/53; 438/98; 438/485; 438/482; 427/585; 427/588
(58) Field of Search .................. 136/258, 255, 136/261; 257/458, 52, 53; 438/96, 485, 482; 427/585, 588

(56) References Cited

U.S. PATENT DOCUMENTS 5,034,333 A * 7/1991 Kim ........................ 438/96
5,648,293 A * 7/1997 Hayama et al. ............. 438/485
6,043,427 A  3/2000 Nishimoto ................. 136/258

FOREIGN PATENT DOCUMENTS

| JP | 59-181581  |   | 10/1984 |
|----|------------|---|---------|
| JP | 2-222178 A | * | 9/1990  |
| JP | 5-335244 A | * | 12/1993 |
| JP | 6-85291    |   | 3/1994  |
| JP | 7-99776    |   | 10/1995 |

* cited by examiner

Primary Examiner—Alan Diamond
(74) Attorney, Agent, or Firm—Fitzpatrick, Cella, Harper & Scinto

(57) ABSTRACT

In a semiconductor thin-film formation process comprising feeding a semiconductor thin-film material gas into a discharge space, and applying a high-frequency power thereto to cause plasma to take place and decompose the material gas to form an amorphous semiconductor thin film on a desired substrate, the high-frequency power is applied changing its power density continuously or stepwise from a high power density to a low power density and thereafter again changing the power density continuously or stepwise from a low power density to a high power density, to form a semiconductor thin film made different in film quality in the direction of layer thickness while retaining the same conductivity type. This process enable formation of high-quality semiconductor thin films by plasma CVD.

5 Claims, 11 Drawing Sheets

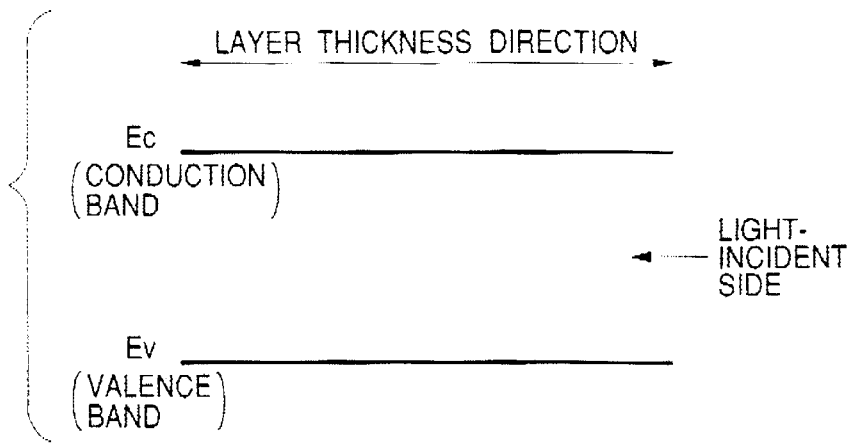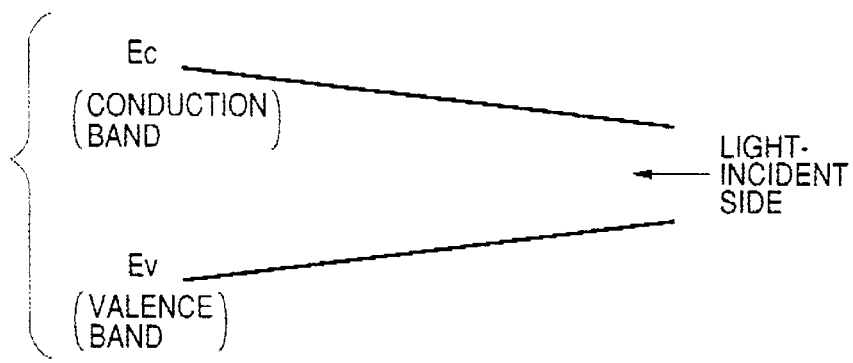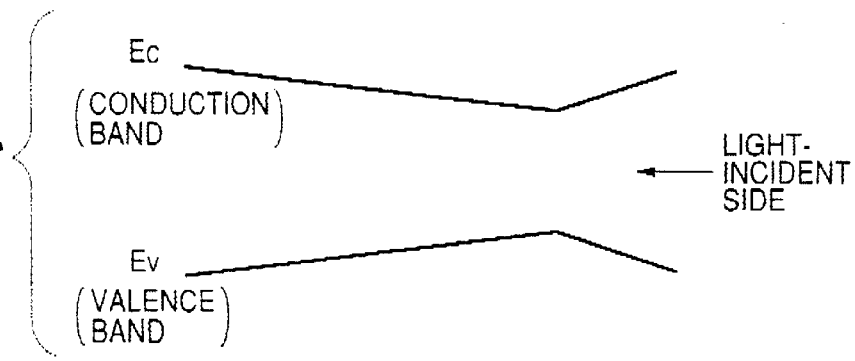

SEMICONDUCTOR THIN-FILM FORMATION PROCESS, AND AMORPHOUS SILICON SOLAR-CELL DEVICE

BACKGROUND OF THE INVENTION

1. Field of the Invention

This invention relates to a process for forming a semiconductor thin film by plasma CVD (chemical vapor deposition). More particularly, this invention relates to a process for forming an amorphous semiconductor for making up semiconductor functional devices such as solar cells, as exemplified by a process for forming by plasma CVD a photovoltaic device such as a solar cell making use of amorphous silicon or amorphous silicon alloy. This invention also relates to an amorphous-silicon solar-cell device obtained by such a process.

2. Related Background Art

Plasma CVD is a process commonly used as a process for forming amorphous semiconductor thin films and microcrystalline semiconductor thin films.

The plasma CVD is a process in which material gases are fed into a chamber and the chamber is evacuated by means of an evacuation pump, where direct-current electric power or high-frequency or microwave electric power is applied to cause the material gases to ionize, dissociate and excite in the form of plasma to form a deposited film on a substrate. Conventionally, glow discharge or RF (radio frequency) discharge making use of high-frequency power has been employed, using parallel-plate electrodes.

Where silicon-type amorphous or microcrystalline semiconductor thin films are formed, used as material gases are, e.g., $SiH_4$, $Si_2H_6$, $SiF_4$ and $Si_2F_6$. $BF_3$, $B_2H_6$, $PH_3$ and so forth are also used as dopant gases. Also, where silicon-germanium amorphous thin film or microcrystalline semiconductor thin film is formed, $GeH_4$ gas is often used as a material gas in addition to the above gases. Pressure (for plasma) in the chamber ranges from about 13 Pa to about 1,330 Pa when electric power of from direct current to high-frequency power is applied. When microwave power is applied, the pressure ranges from about 0.13 Pa to about 133 Pa. The substrate is heated to a temperature of from 200 to 400° C.

Here, an example is described in which amorphous silicon thin films are formed by commonly available plasma CVD making use of a plasma CVD reactor which is a typical semiconductor thin-film formation apparatus, as shown in FIG. 2. In FIG. 2, reference numeral 1 denotes a deposited-film-forming chamber; 2, an evacuation pump (rotary pump and mechanical booster pump); 3, an evacuation piping; 4, a valve; 5, a conductance regulation valve: and 6, a controller of the conductance regulation valve. Reference numeral 7 denotes the cathode electrode: 8, a high-frequency power source; 9, a matching assembly; 10, a high-frequency power guide; 11, a substrate holder: 12, a substrate; 13, a heater; 14, heater controller; and 15, a heater power source. Reference numeral 16 denotes gas cylinders; 17, a gas flow rate controller; and 18, a gas feed pipe. Reference numeral 19 denotes a pressure gauge; and 20, a discharge (plasma) space.

The substrate 12 is fixed to the substrate holder 11, and a substrate take-in/out opening (not shown) is closed, where its inside is evacuated by means of the evacuation pump 2 so as to produce a vacuum. The substrate 12 is heated to temperature of conditions for deposited-film formation by means of the heater 13, fixed to the substrate holder 11. Into the discharge space 20 inside the chamber 1, a plurality of material gases for deposited-film formation ($SiH_4$, $Si_2H_6$, $H_2$, doping gas) whose flow rates have been controlled by the gas flow rate controller 17 are mixedly fed from the gas cylinders 16 through the gas feed pipe 18. To the cathode electrode 7, a desired high-frequency (13.56 MHz) power is applied from the high-frequency power source 8 to cause discharge to take place in the discharge space 20 formed between the cathode electrode 7 and the substrate 12 and substrate holder 11 which face the cathode to serve as the anode electrode. The discharge is regulated by the matching assembly 9. The gases inside the chamber are driven off through the evacuation piping 3, and are always kept replaced with gases fed anew. The pressure of the discharge space 20 is monitored by the pressure gauge 19. Signals of this pressure are sent to the controller 6 of the conductance regulation valve 5 provided in the evacuation piping 3, which regulates the degree of opening of the conductance regulation valve 5 to control the pressure inside the discharge space 20 to a constant level. The material gases for deposited-film formation are ionized, dissociated and excited in the plasma inside the discharge space 20 to form a deposited film on the substrate.

The conductance regulation valve 5 is useful for regulating the pressure to any desired level without dependence on the flow rates of material gases. The conductance regulation valve 5 changes the cross-sectional area of the evacuation piping 3 to increase or decrease evacuation conductance.

After the deposited-film formation is completed, the feeding of material gases is stopped, and a purging gas (He, Ar or the like) is newly fed in to displace the material gases remaining in the deposited-film-forming chamber 1 and evacuation pump 2. After purged, the deposited-film-forming chamber 1 is left to cool, where its inside is returned to atmospheric pressure and the substrate with the deposited film formed thereon is taken out.

Where i-type semiconductor layers of p-i-n semiconductor devices are formed by the above process, as disclosed in U.S. Pat. No. 5,034.333, it is reported that highly efficient solar cells can be obtained by forming the i-type semiconductor layer at a low-controlled high-frequency power at its part vicinal to the p- or n-type semiconductor layer. As also disclosed in Japanese Patent Publication No. 7-99776 and Japanese Patent Application Laid-Open No. 6-85291, it is reported that solar cells can be improved in characteristics by forming a buffer layer at a low rate of film formation in the vicinity of the p- or n-type semiconductor layer. As an easy method for lowering such a rate of film formation, there is a method in which RF power is lowered.

However, as a result of extensive studies repeatedly made in order to form high-quality semiconductor thin films by plasma CVD, it has become clear that, where in the p-i-n semiconductor devices the i-type semiconductor layer is formed for its part vicinal to the p- or n-type semiconductor layer as in the above prior art, the characteristics are not necessarily be improved even when the rate of film formation is lowered or, more directly, the high-frequency power applied to the discharge furnace is lowered to form the buffer layer at the p/i or n/i interface.

SUMMARY OF THE INVENTION

Accordingly, an object of the present invention is to provide a process for forming a high-quality semiconductor thin film by plasma CVD and by a new method different from the above prior art, and an amorphous-silicon solar-cell device obtained using such a process.

The present invention is characterized by constituting a semiconductor thin-film formation process as described below, in order to solve the above problems.

That is, the semiconductor thin-film formation process of the present invention is characterized by a semiconductor thin-film formation process comprising feeding a material gas for a semiconductor thin film into a discharge space formed in an inside-evacuatable film-forming chamber, and applying a high-frequency power thereto to cause plasma to take place and decompose the material gas to form an amorphous semiconductor thin film on a desired substrate, wherein, the high-frequency power is applied changing its power density continuously or stepwise from a high power density to a low power density and thereafter again changing the power density continuously or stepwise from a low power density to a high power density, to form a semiconductor thin film made different in film quality in the direction of layer thickness while retaining the same conductivity type.

The semiconductor thin-film formation process of the present invention is also characterized in that the high power density and the low power density may be in a ratio extending at least twice.

The semiconductor thin-film formation process of the present invention is also characterized in that the material gas may comprise a material gas containing at least silicon.

The semiconductor thin-film formation process of the present invention is also characterized in that the semiconductor thin film may be an amorphous silicon film, and the high power density and low power density of the high-frequency power to be applied are power densities such that the amorphous silicon film at its part formed at the corresponding power density shows Raman shift having peaks positioned within the range of from 490 $cm^{-1}$ to 510 $cm^{-1}$ and the range of from 470 $cm^{-1}$ to 490 $cm^{-1}$, respectively.

The amorphous-silicon solar-cell device of the present invention is also characterized by comprising a p-i-n amorphous-silicon solar-cell device, wherein the Raman shift at an i-type amorphous silicon layer at its part vicinal to the n/i interface or vicinal to the p/i interface has a peak positioned within the range of from 490 $cm^{-1}$ to 510 $cm^{-1}$ and the Raman shift at the other part of the i-type amorphous silicon layer has a peak positioned within the range of from 470 $cm^{-1}$ to 490 $cm^{-1}$.

BRIEF DESCRIPTION OF THE DRAWINGS

FIGS. 4A, 4B and 4C are diagrammatic views for explaining band gap profiles of i-type semiconductor layers. FIG. 4A shows a state where the band gap is uniform in the direction of layer thickness, FIG. 4B a state where it is monotonously changed in the direction of layer thickness, and FIG. 4C a state where it has a turning value in the direction of layer thickness.

DESCRIPTION OF THE PREFERRED EMBODIMENTS

In the semiconductor thin-film formation process of the present Invention, at least one material gas for the semiconductor thin film is fed into a discharge space formed in an inside-evacuatable film-forming chamber, and a high-frequency power is applied thereto to cause plasma to take place and decompose the material gas to form an amorphous semiconductor thin film on a desired substrate. In this process, the high-frequency power is applied in a specific manner to form a semiconductor thin film having a specific film quality, as will be detailed later.

In the present invention, the use of a process for forming semiconductor thin films by a plasma CVD process constituted as mentioned above enables formation of good-quality semiconductor thin films.

In the present invention, the substrate may be made of a material including, but not particularly limited to, e.g., metals such as stainless steel, Al, Cr, Ni, Mo, Au, In, Nb, Te, V, Ti, Pt, Pd and Fe, alloys of any of these, and synthetic resins such as polycarbonate, glass and ceramic which have been subjected to surface conductive treatment.

In the present invention, the material gas may include material gases for forming amorphous silicon, such as silane ($SiH_4$) and disilane ($Si_2H_6$), and other material gases such as $GeH_4$.

A dilute gas for the above material gases may include $H_2$, Ar and He.

For the purpose of doping, a dopant gas such as diborane ($B_2H_6$), boron fluoride ($BF_3$) or phosphine ($PH_3$) may simultaneously be fed into the discharge space (film formation space).

In the present invention, at the time of semiconductor thin-film formation (or processing), the substrate may preferably be heated to a temperature of, but not particularly limited to, from 20° C. to 500° C., and more preferably from 100° C. to 450° C.

In the present invention, at the time of semiconductor thin-film formation (or processing), the inside of the film-forming chamber may preferably be evacuated to a pressure (degree of vacuum) of from 0.13 to 1330 Pa. The high-frequency power may preferably be applied at a power of from 0.1 to 10 kW, within the range of which the high-frequency power is changed as will be described below.

What is characterized in the present invention is that, with regard to the high-frequency power to be applied to the discharge space, it is applied changing its power density continuously or stepwise from a high power density to a low power density and thereafter again changing the power density continuously or stepwise from a low power density to a high power density, to form a semiconductor thin film made different in film quality in the direction of layer thickness while retaining the same conductivity type.

This is based on a finding obtained by a preliminary experiment reported below, taking the case of an i-type semiconductor layer formed when a p-i-n amorphous-silicon solar-cell device is produced.

Figure 2:
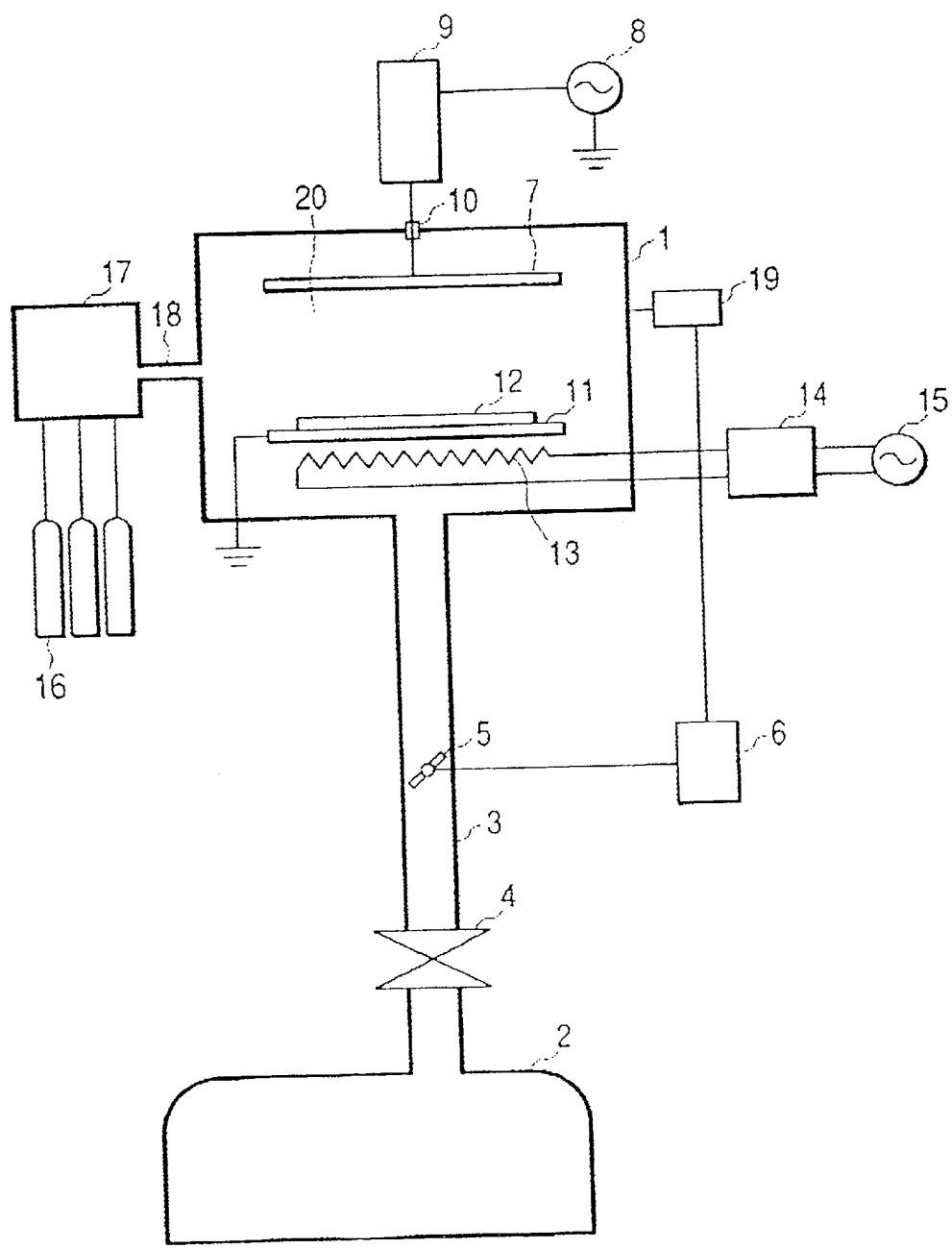
FIG. 2 illustrates an example of a typical semiconductor thin-film formation apparatus.

Using the apparatus shown in FIG. 2, two kinds of substrate 12, a 7059-glass sheet and a silicon wafer, are placed in a discharge space 20. and $SiH_4$ and $H_2$ are fed thereinto as a material gas and a dilute gas, respectively. In the state where the pressure and substrate temperature are kept at desired levels, high-frequency power is applied from a high-frequency power source 8 through a high-frequency electrode 7 to cause plasma to take place for a certain time, whereupon an amorphous silicon semiconductor thin film is deposited on the substrate 12 (hereinafter this film is called a stationary film-formed sample). A plurality of stationary film-formed samples were prepared under application of high-frequency power made different from a high power density to a low power density to examine dependence of various characteristics on high-frequency power.

Figure 3:
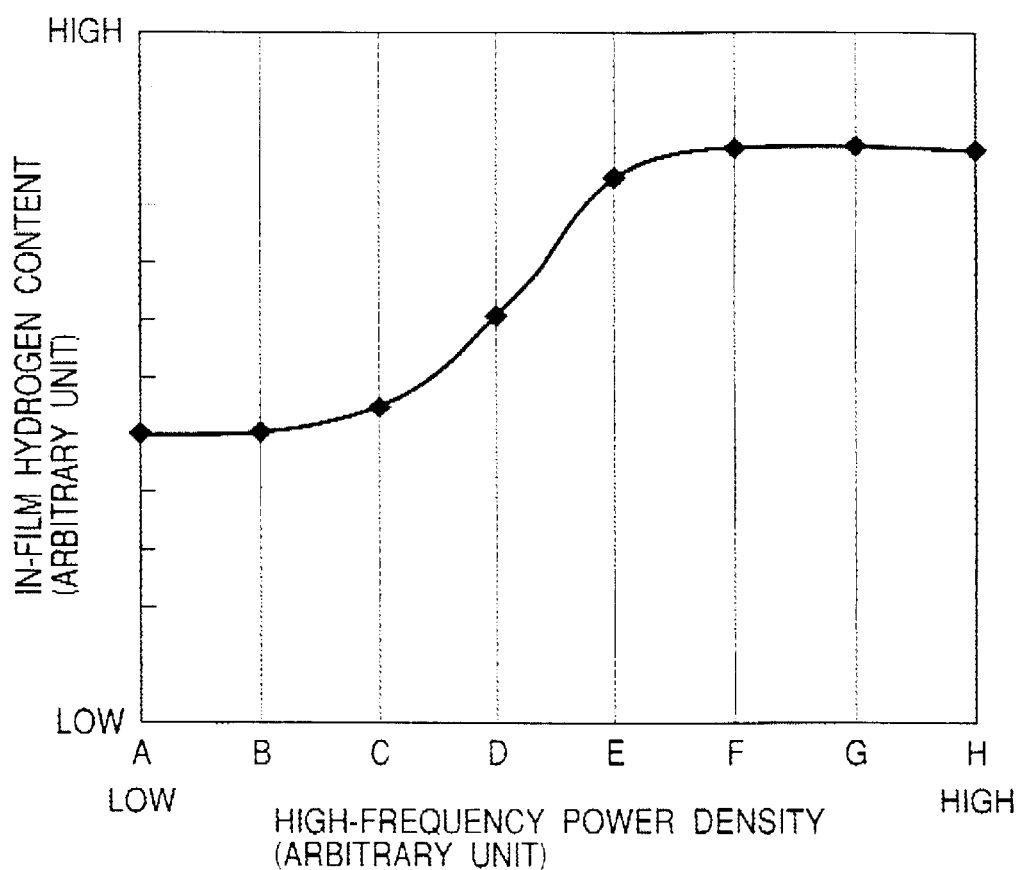
FIG. 3 is a graph showing the dependence on high-frequency power density, of hydrogen content in films of stationary film-formed samples.

In FIG. 3, the dependence of in-film hydrogen content on high-frequency power density is plotted. examined by measurement of infrared (IR) absorption, using the stationary film-formed samples formed on silicon wafers. As can be seen therefrom, there is a tendency that the hydrogen content Increases with an increase in power density especially in the region of power densities C to E. More specifically, the band gap changes with a change in hydrogen content, and hence the band gap can be changed after all by increasing or decreasing high-frequency power density.

Here, as shown in FIG. 4A, the band gap (the energy difference between the conduction band Ec and the valence band Ev) of a film formed under application of a constant high-frequency power is constant in the direction of layer thickness. Meanwhile, it is known that, as one means for improving photoelectric conversion efficiency of solar cells, the solar cells may be so produced as to have band gap profiles as shown in FIGS. 4B and 4C, whereby their photoelectric conversion efficiency can be improved. The present invention can be said to provide one approach to the materialization of such band gap profiles of i-type semiconductor layers of p-i-n semiconductor solar cells.

Here, as a method of changing band gaps of amorphous silicon hydride thin films, a method is known in which the substrate temperature is changed to change the hydrogen content. In the case of films formed at a low temperature (in particular, a substrate temperature of 100° C. or below) and having a high hydrogen content, the films have great band gaps but, at the time of film formation, can not have any energy sufficient for the formation of an optimum state of bonding, so that low-quality films containing many in-film Si—$H_2$ bonds and defects may be formed. On the other hand, in the case of films formed at a high-density high-frequency power, the plasma itself is changed and hence good-quality films having high band gaps and a low defect density can be formed.

Table 1 shows results of estimation of optical band gap and Urbach energy, obtained when, in order to compare a film formed at a low temperature (substrate temperature: 10° C.) with a film formed at a high power density, Ag electrodes are formed by deposition on stationary film-formed samples formed on glass substrates and optical absorption spectra are measured by a constant photocurrent method (CPM). As can be seen therefrom, although the both have optical band gaps substantially equal to each other, the film formed at a low temperature has a greater Urbach energy and more defects than the film formed at a high power density.

TABLE 1

|  | Optical band gap | Urbach energy |
| --- | --- | --- |
| Amorphous silicon thin film formed at a substrate temperature set at a low temperature: | 1.85 eV | 60 meV |
| Amorphous silicon thin film formed at a high-frequency power set at a high power density: | 1.85 eV | 42 meV |

As can also be seen from FIG. 3, it is not the case that the hydrogen content increases monotonously with respect to the high-frequency power density and, as shown in the drawing, the hydrogen content is substantially constant at power densities of power density E or higher. However, comparison of defect densities of films having the same hydrogen content but formed at different power densities as in the case of power densities F and G as shown In the drawing has revealed that the film formed under conditions of power density G has a smaller defect density than the film formed under conditions of power density F. It has also been confirmed by a Raman spectroscopic scattering experiment that a film formed under conditions of power density H, which is a higher power density, shows Raman shift having a peak at 520 $cm^{-1}$ and the film stands partially microcrystalline. As is considered from this fact, there is a possibility that increasing or decreasing the high-frequency power not only has changed the in-film hydrogen content and band gap but also has changed the structure itself of the film to change its film quality.

Figure 5:
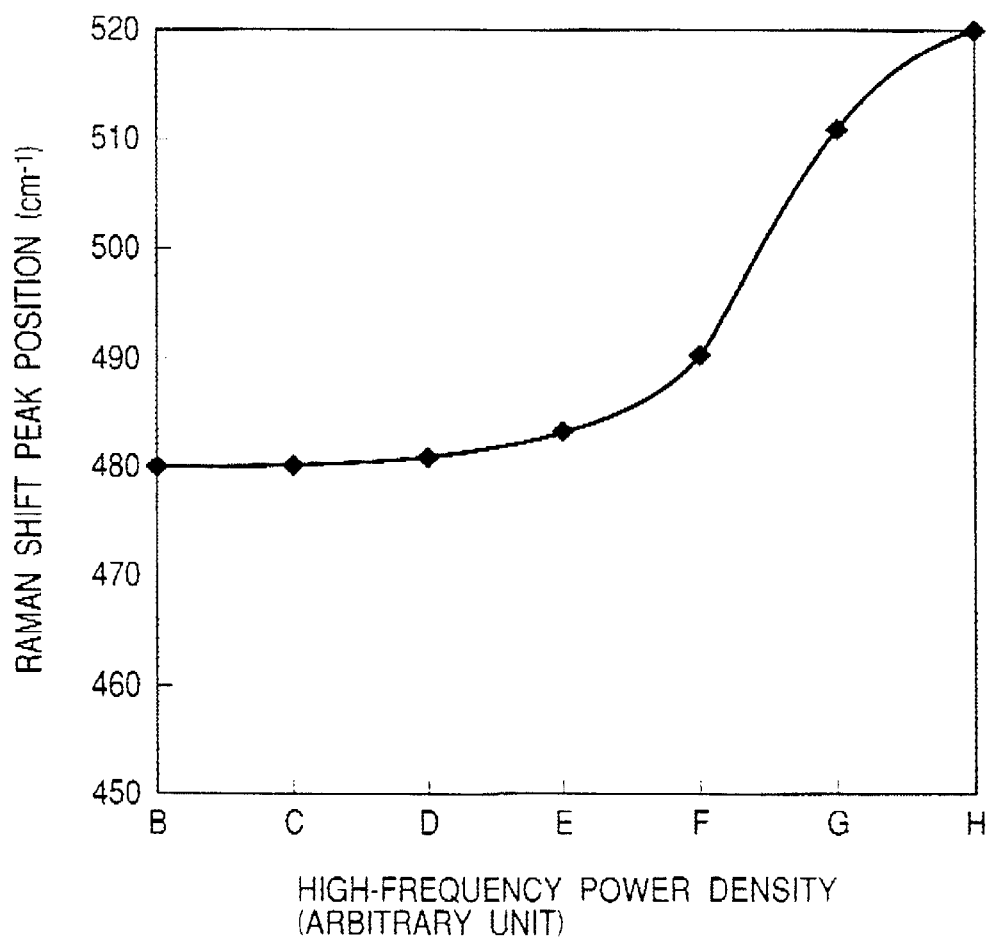
FIG. 5 is a graph showing the dependence on high-frequency power density, of Raman shift peak position in stationary film-formed samples.

Actually, the Raman spectroscopic scattering experiment made on the stationary film-formed samples was made on each film formed at a different high-frequency power density. Changes of peak position of Raman shift with respect to the high-frequency power density are shown in FIG. 5. It has been found therefrom that the peak position of Raman shift is constant at around 480 $cm^{-1}$ but, with an increase in power density, the peak position becomes higher at the power density E as a border, and it has reached 520 $cm^{-1}$ at the power density H as stated above. It has also been found that the peak 520 $cm^{-1}$ also begins to appear approximately where the Raman shift of the amorphous silicon film exceeds 500 $cm^{-1}$ and that the film comes into a state of a crystal mixed with a microcrystalline layer.

Here, the high power density contributory to the improvement in characteristics may preferably be a power density at which not strictly the film showing Raman shift having a peak at 520 $cm^{-1}$ and standing microcrystalline but a film showing Raman shift having a peak at 510 $cm^{-1}$ or below is formed. As being different from a method in which the proportion of microcrystallinity is continuously made higher in the vicinity of a p-type layer as disclosed in Japanese Patent Publication No. 3-54478, the present invention provides a semiconductor thin-film formation process which is novel in the sense that an amorphous layer having different structure and characteristics is superposingly formed.

From these matters, it is preferable in the semiconductor thin-film formation process of the present invention, where the semiconductor thin film is an amorphous silicon film, the high power density and low power density of the high-frequency power to be applied may preferably be power densities such that the amorphous silicon film at its part formed at the corresponding power density shows Raman shift having peaks positioned within the range of from 490 $cm^{-1}$ to 510 $cm^{-1}$ and the range of from 470 $cm^{-1}$ to 490 $cm^{-1}$, respectively. More preferably, the effect of the present invention can be made more remarkable where the power densities are such that the film shows Raman shift having peaks positioned within the range of from 490 $cm^{-1}$ to 500 $cm^{-1}$ and the range of from 475 $cm^{-1}$ to 485 $cm^{-1}$, respectively.

Figure 6:
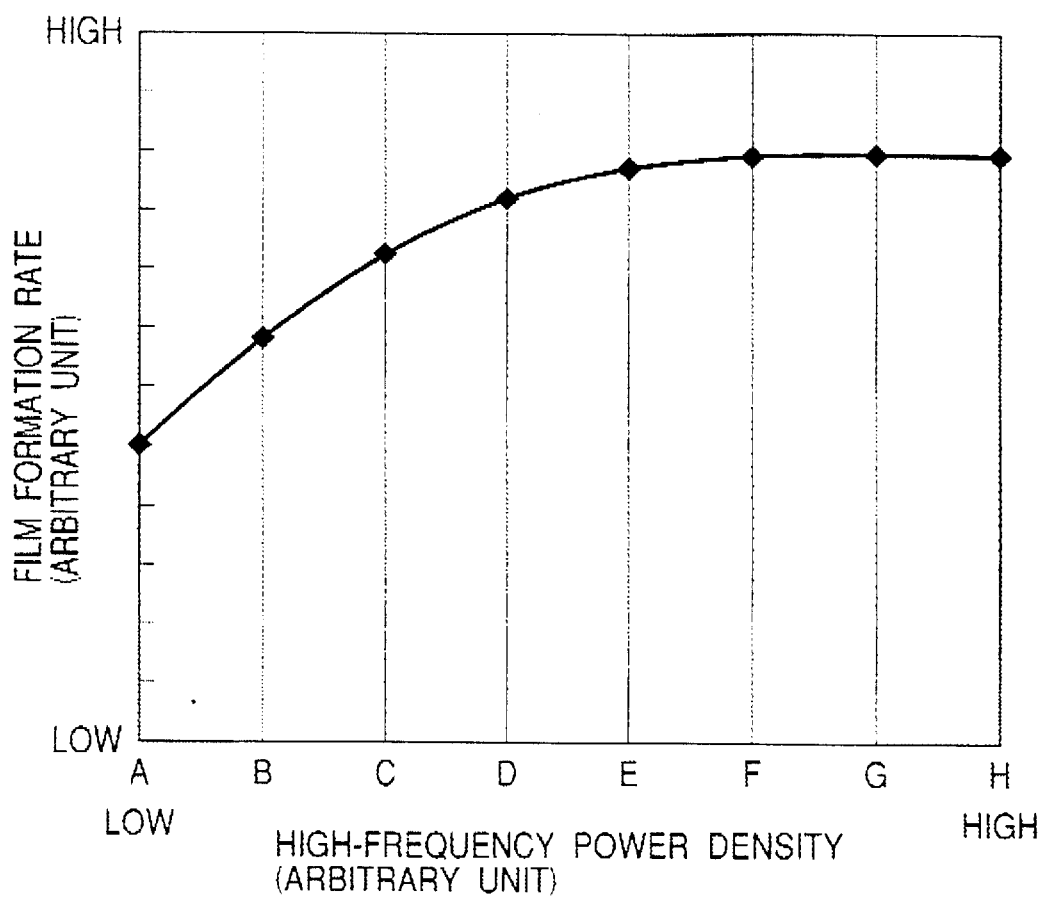
FIG. 6 is a graph showing the dependence on high-frequency power density, of the rate of film formation in stationary film-formed samples.

FIG. 6 shows the dependence of the rate of film formation on the high-frequency power density. As can be seen therefrom, the application of high-frequency power at a high power density brings about an increase in the rate of film formation. In particular, the present invention is characterized in that, where semiconductor devices having, e.g., p-i-n junction are formed, the film is formed at a high power density, i.e., at a high rate of film formation, in respect of an i-type semiconductor layer at its part vicinal to the p/i or n/i interface.

By the way, as disclosed in, e.g., U.S. Pat. No. 5,034,333 and Japanese Patent Publications No. 7-99776 and No. 3-54478, where the i-type semiconductor layer is formed for its part vicinal to the p/i or n/i interface, a method is presented in which the high-frequency power or rate of film formation is lowered so as to improve device characteristics. On the other hand, the present invention provides a process for forming semiconductor thin films having high characteristics, on the basis of a directly opposite concept.

Figure 1:
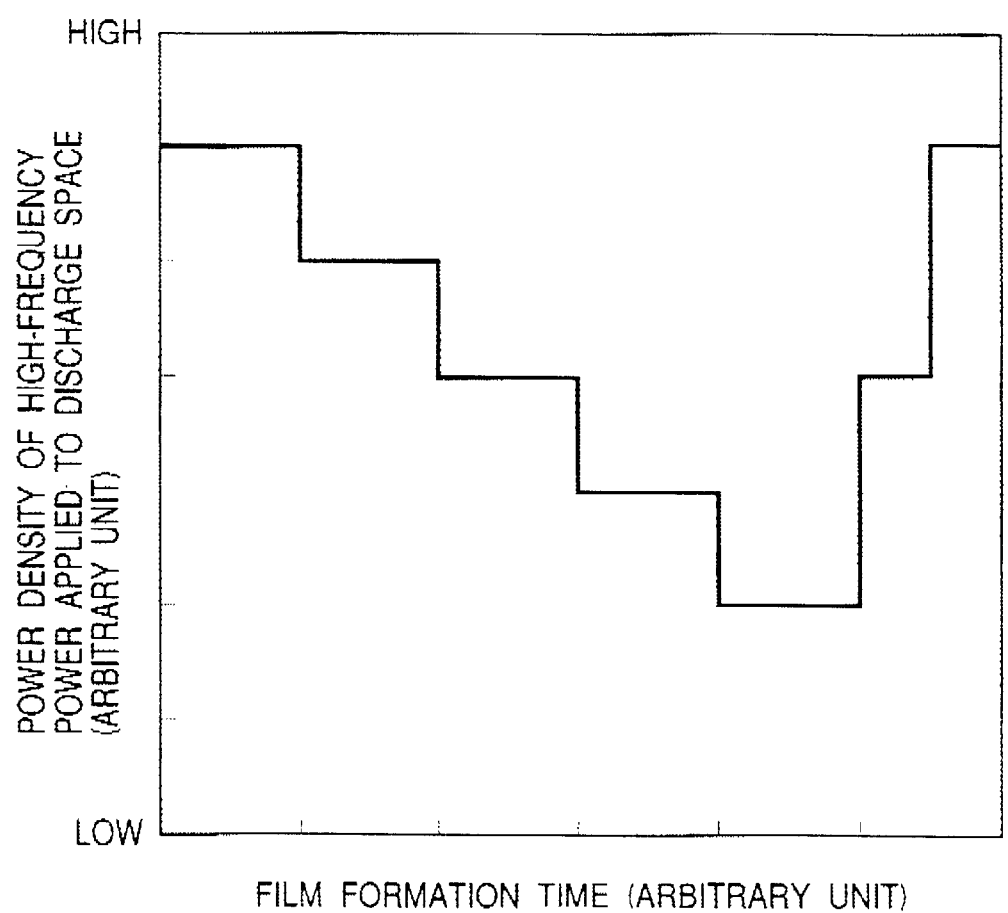
FIG. 1 is a diagrammatic view of how to apply a high-frequency power in the semiconductor thin-film formation process of the present invention.

Thus, in the present invention, it is characterized in that as shown in FIG. 1 the high-frequency power to be applied to the discharge space is applied changing its power density continuously or stepwise from a high power density to a low power density, with time of film formation, and thereafter again changing the power density continuously or stepwise from a low power density to a high power density, whereby the band gap profile in the film is controlled and at the same time the film structure is made stepwise different to form a semiconductor thin film having a good quality. Here, in FIG. 1, the ordinate is given by the power density.

Where the film is continuously formed using the same discharge space, since the electric power and the power density have a propotional relationship to each other, these can be discussed as a parameter. However, where the present invention is applied using a plurality of different discharge spaces, power density per unit area of an electrode, or where power is introduced from a waveguide, power density per unit discharge space is essentially an important parameter in order to materialize an equivalent plasma condition in each discharge space. Power density is obtained by (power applied to an electrode/area of an electrode), or (power applied from a waveguide to a discharge space/volume of a discharge space).

The manner of changing the high-frequency power density is not limited to the stepwise changing as shown in FIG. 1, and any continuous changing can also be likewise effective.

In the present invention, the high power density and low power density of the high-frequency power to be applied to the interior of the discharge furnace may preferably be in a ratio extending at least twice. This can materialize the difference of band gap that enables improvement of film characteristics. Since, however, the optimum value of this power density ratio also relates with other film formation conditions, it is desirable to select the optimum value appropriately.

In the present invention, in a process for forming the i-type semiconductor layer of a p-i-n semiconductor device, the film's part formed at a low power density is formed at an asymmetric position in the direction of layer thickness, and the layer thickness of the film from its part formed at a low power density to its part formed at a high power density on the p-type semiconductor layer side and the layer thickness of the film from its part formed at a low power density to its part formed at a high power density on the n-type semiconductor layer side may preferably in a ratio of 1:3 or higher, more preferably 1:5 or higher, and most preferably 1:8 or higher. Thus, when the device is driven as a photovoltaic device, it is improved in hole mobility and improved in short-circuit current density (Jsc) and fill factor (F.F.) in I–V characteristics, and can be expected to be improved in photoelectric conversion efficiency.

Examples of the process for forming the semiconductor thin film according to the present invention are given below. The present invention is by no means limited by these Examples. Since in the following Examples and Comparative Examples, films are formed in the same discharge space, "power" which can be treated as a parameter equal to "power density" is fixed or changed. Size of an electrode applied power is 900 mm×500 mm.

EXAMPLE 1

Using the plasma CVD system shown in FIG. 2 and according to the production procedure shown below, the process of the present invention was carried out in the formation of an i-type semiconductor layer to produce a p-i-n amorphous-silicon solar-cell device. Conditions for forming each layer are shown in Table 2.

Using a sputtering system (not shown), a SUS430BA stainless steel substrate 12 on which an Ag thin film of 1 $\mu$m thick and a ZnO thin film of 1 $\mu$m thick have superposingly been formed as the lower electrode is prepared. The substrate 12 with the lower electrode is placed on the substrate holder 11, and the inside of the deposited-film-forming chamber 1 is evacuated to $1.3 \times 10^{-2}$ Pa by means of the evacuation pump 2.

First, an n-type semiconductor layer is formed in the following manner under conditions for forming the n-type semiconductor layer as shown in Table 2. The substrate 12 is heated to substrate temperature by means of the heater 13 fixed to the substrate holder 11. Into the discharge space 20 inside the chamber 1, a plurality of material gases for deposited-film formation ($SiH_4$, $H_2$, $PH_3$) whose flow rates have been controlled via the gas flow rate controller 17 are mixedly fed from the gas cylinders 16 through the gas feed pipe 18. To the cathode electrode 7, a desired high-frequency (13.56 MHz) power is applied from the high-frequency power source 8 to cause discharge to take place in the discharge space 20 formed between the cathode electrode 7 and the substrate 12 and substrate holder 11 which face the cathode to serve as the anode electrode. The discharge is regulated by the matching assembly 9. The gases inside the chamber are driven off through the evacuation piping 3, and are always kept replaced with gases fed anew. The pressure of the discharge space 20 is monitored by the pressure gauge 19. Signals of this pressure are sent to the controller 6 of the conductance regulation valve 5 provided in the evacuation piping 3, which regulates the degree of opening of the conductance regulation valve 5 to control the pressure inside the discharge space 20 to a constant level. The material gases for deposited-film formation are ionized, dissociated and excited in the plasma inside the discharge space 20 to form a deposited film on the substrate.

Figure 7:
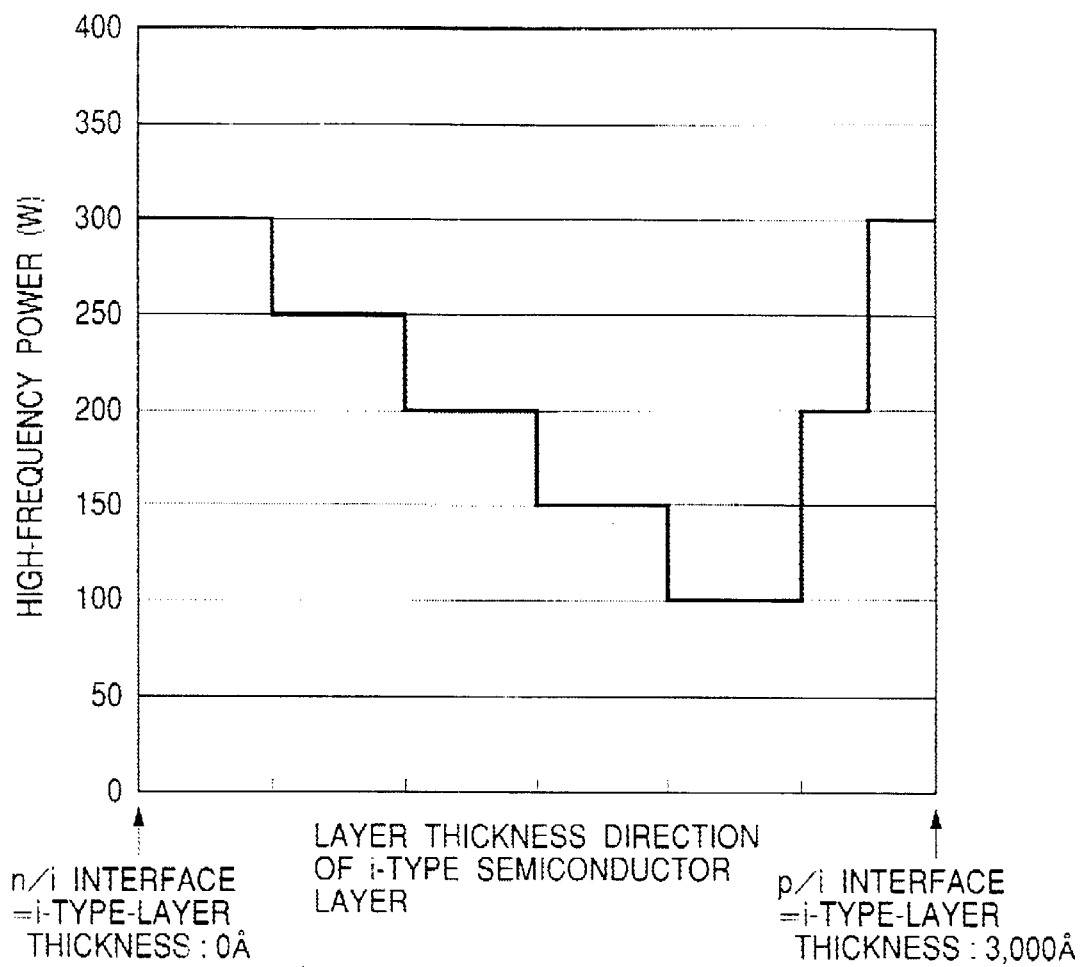
FIG. 7 shows how to apply high-frequency power, in relation to the direction of layer thickness, among conditions for forming semiconductor thin films formed in Example 1.

Next, the feeding of material gases is stopped, and a purging gas (He, Ar or the like) is newly fed in to displace the material gases remaining in the deposited-film-forming chamber 1 and evacuation pump 2. After the dopant gas ($PH_3$) and so forth remaining in the chamber 1 have thoroughly been displaced, an i-type semiconductor layer is formed in the same manner as the case of the n-type semiconductor layer but under conditions for forming the i-type semiconductor layer as shown in Table 2. Here, $SiH_4$ and $H_2$ are used as material gases for deposited-film formation, and the high-frequency power is applied changing it as shown in FIG. 7. In FIG. 7, changes of the high-frequency power applied at the time of formation of the i-type semiconductor layer are plotted in the direction of layer thickness, As shown in FIG. 7, the high-frequency power (13.56 MHz) applied from the cathode electrode 7 is stepwise decreased from 300 W to 100 W with time of film formation and thereafter again stepwise increased from 100 W to 300 W to form the i-type semiconductor layer. Here, the film formation time is so regulated that the i-type semiconductor layer Is formed in a layer thickness of 3,000 Å.

Next, the feeding of material gases is again stopped, and a purging gas (He, Ar or the like) is newly fed in to displace the material gases remaining in the deposited-film-forming chamber 1 and evacuation pump 2. Thereafter, a p-type semiconductor layer is formed in the same manner as the case of the n-type semiconductor layer but under conditions for forming the p-type semiconductor layer as shown in Table 2. Here, $SiH_4$, $H_2$ and $BF_3$ are used as material gases for deposited-film formation.

After the deposited films have been formed, a purging gas (He, Ar or the like) is newly fed in to displace the material gases remaining In the deposited-film-forming chamber 1 and evacuation pump 2. After purged, the deposited-film-forming chamber 1 is left to cool, where its inside is returned to atmospheric pressure and the substrate with the deposited films formed thereon is taken out.

Figure 8:
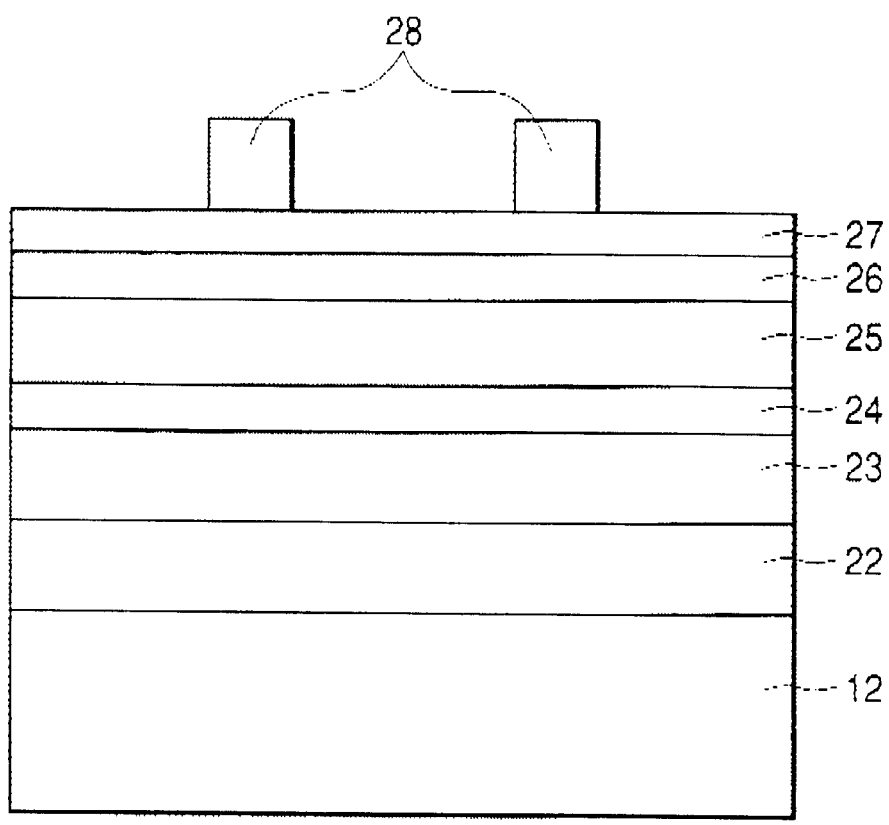
FIG. 8 is a diagrammatic cross-sectional view of an amorphous-silicon solar-cell device.

Finally, on the substrate 12 on which the n-, i- and p-type semiconductor layers have been formed, ITO (indium-tin-oxide) is deposited as a transparent electrode by vacuum deposition in a thickness of 750 Å, and Au is further deposited as a collector electrode by vacuum deposition in a thickness of 3,000 Å to make up a p-i-n amorphous-silicon solar-cell device. This device is diagrammatically shown in FIG. 8. In FIG. 8, reference numeral 12 denotes the substrate; 22, the Ag thin film; 23, the ZnO thin film; 24, the n-type semiconductor layer; 25, the i-type semiconductor layer; 26, the p-type semiconductor layer; 27, the ITO transparent electrode; and 28, the collector electrode.

TABLE 2

| Layer thickness (Å) | Gases used & flow rate (sccm) | | High frequency power (W) | Pressure (Pa) | Substrate temp. (° C.) |
|---|---|---|---|---|---|
| Layers | | | | | |
| n-Type semiconductor layer: | | | | | |
| 200 | $SiH_4$ | 20 | 30 | 133 | 250 |
| | $PH_3$ (2% diluted) | 15 | | | |
| | $H_2$ | 300 | | | |
| i-Type semiconductor layer: | | | | | |
| 3,000 | $SiH_4$ | 20 | Changed in layer thickness direction (see FIG. 7) | 267 | 200 |
| | $H_2$ | 1,000 | | | |
| p-Type semiconductor layer: | | | | | |
| 100 | $SiH_4$ | 5 | 1,000 | 133 | 150 |
| | $BF_3$ (2% diluted) | 15 | | | |
| | $H_2$ | 500 | | | |

Substrate: SUS430BA stainless steel of 0.2 mm thick
Electrode-substrate distance: 20 mm
High-frequency power source frequency (RF band) for n-, i- and p-type semiconductor layers: 13.56 MHz Comparative Example 1

A p-i-n amorphous-silicon solar-cell device was produced in the same manner and under the same conditions as in Example 1 except that, when an i-type semiconductor layer was formed, the high-frequency power applied from the cathode electrode 7 was made constant to form the i-type semiconductor layer. Here, a plurality of solar-cell devices were produced under application of the high-frequency power at 100 W, 150 W, 200 W, 250 W and 300 W Individually. Also, the film formation time was so regulated that each i-type semiconductor layer was formed in a layer thickness of 3,000 Å.

The p-i-n amorphous-silicon solar-cell devices produced in Example 1 and Comparative Example 1 were evaluated on their I–V characteristics to compare their photoelectric conversion efficiency.

Figure 9:
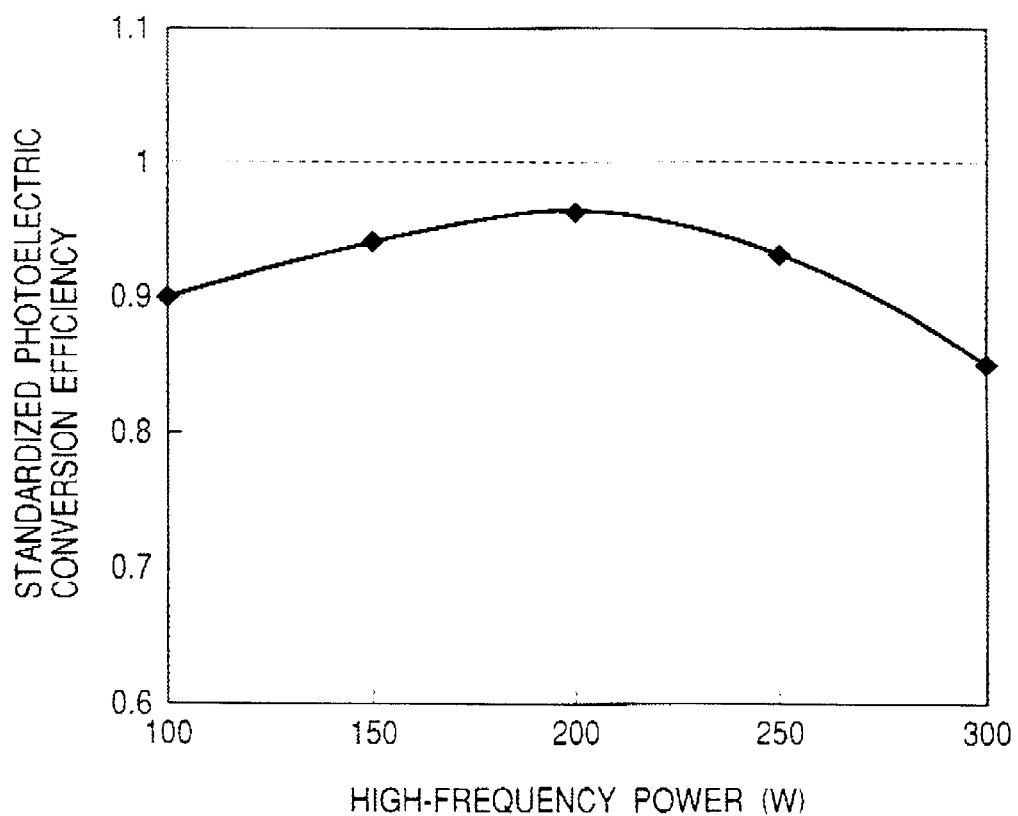
FIG. 9 is a graph showing the relationship between photoelectric conversion efficiency and high-frequency power; the former being standardized on that of solar-cell devices produced in Comparative Example 1, assuming as 1.00 the value of photoelectric conversion efficiency of a solar-cell device produced in Example 1.

FIG. 9 shows the relationship between photoelectric conversion efficiency and high-frequency power; the former being standardized on that of solar-cell devices produced in Comparative Example 1 having the i-type semiconductor layers formed at different high-frequency power, assuming as 1.00 the value of photoelectric conversion efficiency of the solar-cell device produced in Example 1 according to the process of the present invention. It is seen therefrom that the photoelectric conversion efficiency shows the maximum value at the power of 200 W and lowers in either case at lower power density and higher power density than that. It has also been found that the solar-cell device of Example 1 has been made better in photoelectric conversion efficiency than the device produced at 200 W (hereinafter this device is called Comparative Example 1—1), having the highest characteristics among the solar-cell devices of Comparative Example 1. This has proved the effect of the present invention.

Comparative Example 2

Solar-cell devices were produced in the same manner as the p-i-n amorphous-silicon solar-cell device of Comparative Example 1 except that, when i-type semiconductor layers were formed, the high-frequency power was changed to a low power of 100 W in the regions about 300 Å vicinal to the p-type layer and/or the n-type layer, to form the layers. Also, the film formation time was so regulated that each i-type semiconductor layer was formed in a layer thickness of 3,000 Å.

The solar-cell devices produced in Comparative Example 2 were all made slightly better in photoelectric conversion efficiency than the cell produced as Comparative Example 1—1, but all of them were no match for the solar-cell device of Example 1 in photoelectric conversion efficiency. This proved the effect of the present invention.

EXAMPLE 2

Figure 10:
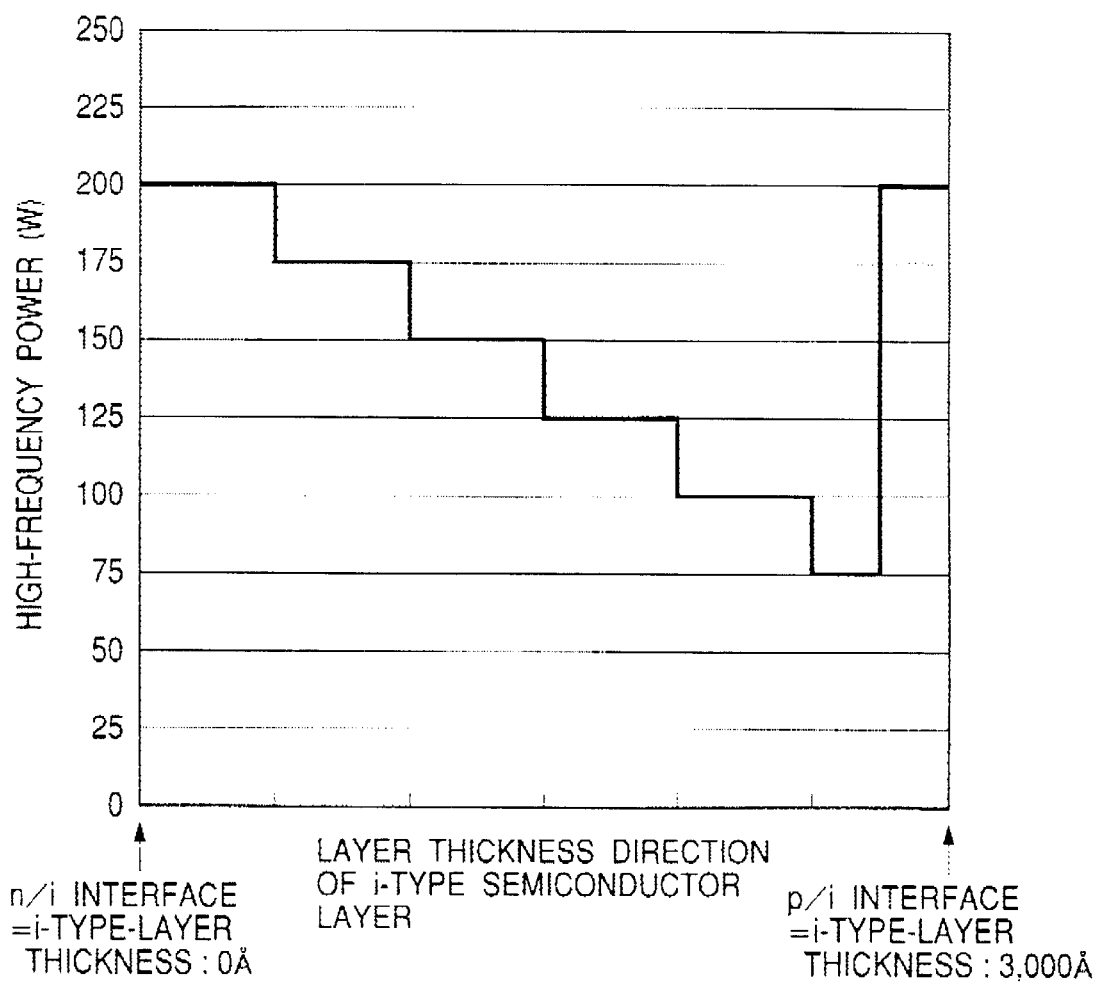
FIG. 10 shows how to apply high-frequency power, in relation to the direction of layer thickness, among conditions for forming semiconductor thin films formed in Example 2.

A p-i-n amorphous-silicon solar-cell device was produced in the same manner and under the same conditions as in Example 1 except that, when an i-type semiconductor layer was formed, the frequency of the high-frequency power was changed to a VHF band of 60 MHz and the layer was formed under conditions of film formation as shown in Table 3. Here, as shown in FIG. 10, the high-frequency power (60 MHz) applied from the cathode electrode 7 was stepwise decreased from 200 W to 75 W with time of film formation and thereafter again stepwise increased from 75 W to 300 W to form the i-type semiconductor layer. Here, the film formation time was so regulated that the i-type semiconductor layer was formed in a layer thickness of 3,000 Å.

TABLE 3

| Layer thickness (Å) | Gases used & flow rate (sccm) | | High frequency power (W) | Pressure (Pa) | Substrate temp. (° C.) |
|---|---|---|---|---|---|
| Layers | | | | | |
| n-Type semiconductor layer: | | | | | |
| 200 | SiH$_4$ | 20 | 30 | 133 | 250 |
| | PH$_3$ | 15 | | | |
| | (2% diluted) | | | | |
| | H$_2$ | 300 | | | |
| i-Type semiconductor layer: | | | | | |
| 3,000 | SiH$_4$ | 30 | Changed in layer thickness direction (see FIG. 10) | 133 | 200 |
| | H$_2$ | 500 | | | |
| p-Type semiconductor layer: | | | | | |
| 100 | SiH$_4$ | 5 | 1,000 | 133 | 150 |
| | BF$_3$ | 15 | | | |
| | (2% diluted) | | | | |
| | H$_2$ | 500 | | | |

Substrate: SUS430BA stainless steel of 0.2 mm thick
Electrode-substrate distance: 10 mm
High-frequency power source frequency (RF band) for n- and p-type semiconductor layers: 13.56 MHz
High-frequency power source frequency (VHF band) for i-type semiconductor layer: 60 MHz Comparative Example 3

A p-i-n amorphous-silicon solar-cell device was produced in the same manner and under the same conditions as in Example 2 except that, when an i-type semiconductor layer was formed, the high-frequency power applied from the cathode electrode 7 was made constant to form the i-type semiconductor layer. Here, a plurality of solar-cell devices were produced under application of the high-frequency power at 75 W, 100 W, 125 W, 150 W, 175 W and 200 W individually. Also, the film formation time was so regulated that each i-type semiconductor layer was formed in a layer thickness of 3,000 Å.

The p-i-n amorphous-silicon solar-cell devices produced in Example 2 and Comparative Example 3 were evaluated on their I–V characteristics to compare their photoelectric conversion efficiency.

Figure 11:
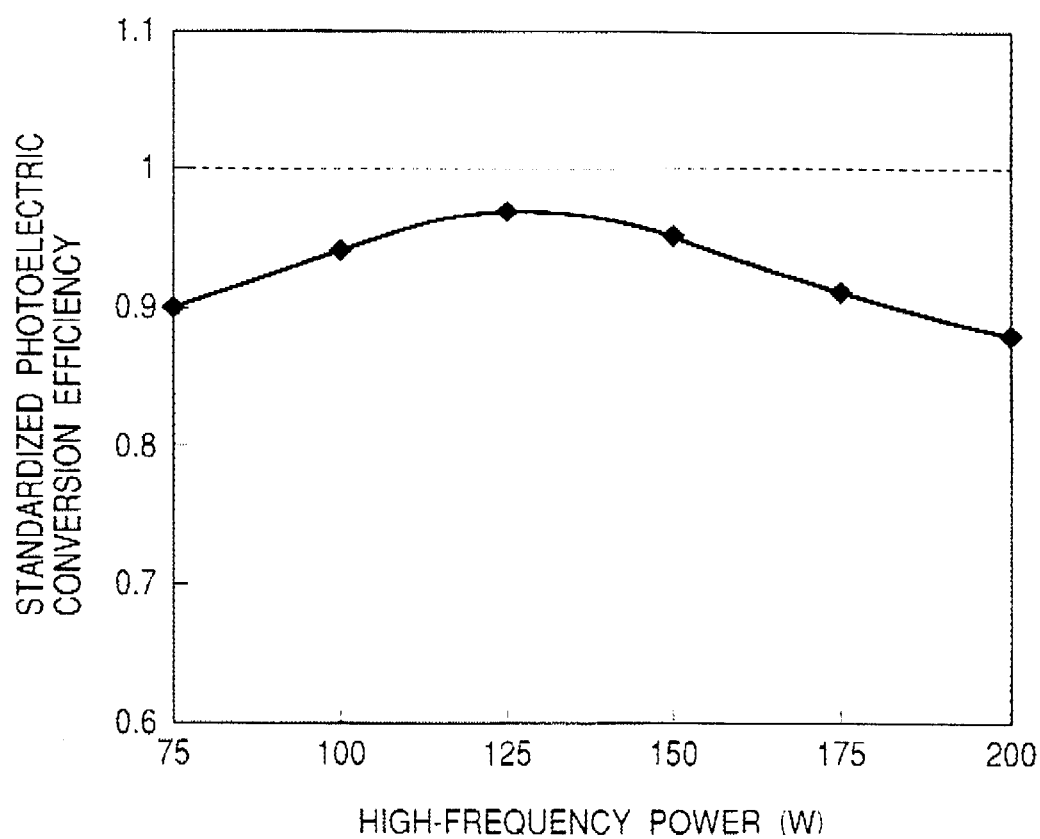
FIG. 11 is a graph showing the relationship between photoelectric conversion efficiency and high-frequency power; the former being standardized on that of solar-cell devices produced in Comparative Example 3, assuming as 1.00 the value of photoelectric conversion efficiency of a solar-cell device produced in Example 2.

FIG. 11 shows the relationship between photoelectric conversion efficiency and high-frequency power; the former being standardized on that of individual solar-cell devices produced in Comparative Example 3, assuming as 1.00 the value of photoelectric conversion efficiency of the solar-cell device produced in Example 2. It is seen therefrom that the photoelectric conversion efficiency shows the maximum value at the power of 125 W and lowers in either case at lower power density and higher power density than that. It has also been found that the solar-cell device of Example 2 has been made better in photoelectric conversion efficiency than the device produced at 125 W, having the highest characteristics among the solar-cell devices of Comparative Example 3. This has proved the effect of the present Invention.

As described above, according to the present invention, the high-frequency power is applied changing its power density continuously or stepwise from a high power density to a low power density, and thereafter again changing the power density continuously or stepwise from a low power density to a high power density, to form the semiconductor thin film made different in film quality in the direction of layer thickness while retaining the same conductivity type. Thus, the band gap profile in the film can be controlled and at the same time the film structure can be made stepwise different to form semiconductor thin films having a good quality In particular, semiconductor functional devices Such as solar cells can be improved in photoelectric conversion efficiency.

What is claimed is:

1. A semiconductor thin-film formation process comprising feeding a material gas for a semiconductor thin film into a discharge space formed in an inside-evacuatable film-forming chamber, and applying a high-frequency power thereto to cause plasma to take place and decompose the material gas to form an amorphous semiconductor thin film on a substrate, wherein, the high-frequency power is applied changing its power density continuously or stepwise from a high power density to a lower power density and thereafter again changing the power density continuously or stepwise from the lower power density to the high power density, to form a semiconductor thin film made different in film quality in the direction of layer thickness while retaining the same conductivity type.

2. The semiconductor thin-film formation process according to claim 1, wherein the high power density and the low power density are in a ratio extending at least twice.

3. The semiconductor thin-film formation process according to claim 1, wherein the material gas comprises a material gas containing at least silicon.

4. The semiconductor thin-film formation process according to claim 1, wherein the semiconductor thin film is an amorphous silicon film, and the amorphous silicon film formed at the high power density shows Raman shift having peaks positioned within the range of from 490 cm$^{-1}$ and the amorphous silicon film formed at the lower power density shows Raman shift having peaks positioned within the range of from 470 cm$^{-1}$ to 490 cm$^{-1}$.

5. A p-i-n amorphous-silicon solar-cell device comprising an i-type amorphous silicon layer formed by feeding a material gas into a discharge space formed in an inside-evacuatable film-forming chamber, and applying a high-frequency power thereto to cause plasma to take place and decompose the material gas, wherein the i-type amorphous silicon layer at its part vicinal to the n/i interface or vicinal to the p/i interface is formed by applying a high-frequency power of a high power density and shows Raman shift having peaks positioned within the range of from 490 $cm^{-1}$ to 510 $cm^{-1}$ and the other part of the i-type amorphous silicon layers is formed by applying a high-frequency power of a low power density and has Raman shift having peaks positioned within the range of from 470 $cm^{-1}$ to 490 $cm^{-1}$.

* * * * *

UNITED STATES PATENT AND TRADEMARK OFFICE
CERTIFICATE OF CORRECTION

PATENT NO. : 6,531,654 B2
DATED : March 11, 2003
INVENTOR(S) : Sugiyama et al.

It is certified that error appears in the above-identified patent and that said Letters Patent is hereby corrected as shown below:

Title page,
Item [57], ABSTRACT,
Line 13, "enable" should read -- enables --.

Column 1,
Line 52, "valve:" should read -- valve; --;
Line 54, "electrode:" should read -- electrode; -- and
Line 56, "holder:" should read -- holder; --.

Column 4,
Line 26, "Invention," should read -- invention, --.

Column 5,
Line 16, "20." should read -- 20, --;
Line 30, "plotted." should read -- plotted, --; and
Line 34, "Increases" should read -- increases --.

Column 6,
Line 28, "In" should read -- in --.

Column 9,
Line 33, "Is" should read -- is --.

Column 10,
Line 37, "Individually." should read -- individually. --.

Column 12,
Line 17, "Inven-" should read -- inven- --;
Line 31, "quality" should read -- quality. --;
Line 31, "Such" should read -- such --;

UNITED STATES PATENT AND TRADEMARK OFFICE
CERTIFICATE OF CORRECTION

PATENT NO.    : 6,531,654 B2
DATED         : March 11, 2003
INVENTOR(S)   : Sugiyama et al.

It is certified that error appears in the above-identified patent and that said Letters Patent is hereby corrected as shown below:

<u>Column 12 cont'd,</u>
Lines 44 and 46, "lower" should read -- low --;
Line 60, "490cm$^{-1}$" should read -- 490cm$^{-1}$ to 510cm$^{-1}$ --; and
Line 61, "lower" should read -- low --.

Signed and Sealed this

Twenty-fifth Day of November, 2003

JAMES E. ROGAN
*Director of the United States Patent and Trademark Office*